US010598704B2

(12) United States Patent
Liu et al.

(10) Patent No.: US 10,598,704 B2
(45) Date of Patent: Mar. 24, 2020

(54) UNIVERSAL GRID ANALYZER

(71) Applicant: University of Tennessee Research Foundation, Knoxville, TN (US)

(72) Inventors: Yilu Liu, Knoxville, TN (US); Lingwei Zhan, King of Prussia, PA (US); Wenxuan Yao, Knoxville, TN (US)

(73) Assignee: UNIVERSITY OF TENNESSEE RESEARCH FOUNDATION, Knoxville, TN (US)

( * ) Notice: Subject to any disclaimer, the term of this patent is extended or adjusted under 35 U.S.C. 154(b) by 231 days.

(21) Appl. No.: 14/802,307

(22) Filed: Jul. 17, 2015

(65) Prior Publication Data

US 2017/0016940 A1    Jan. 19, 2017

(51) Int. Cl.
*G01R 21/00* (2006.01)
*G04G 3/00* (2006.01)

(52) U.S. Cl.
CPC .................................. *G01R 21/00* (2013.01)

(58) Field of Classification Search
CPC .. G01R 21/00; G01R 13/345; G01R 19/2509; G01R 27/28; G04G 3/00; H04B 1/16; G01P 3/489; G06F 3/05; H04L 2027/0067

See application file for complete search history.

(56) References Cited

U.S. PATENT DOCUMENTS

| | | | | |
|---|---|---|---|---|
| 5,724,396 | A * | 3/1998 | Claydon | H04L 1/0054 375/355 |
| 5,794,021 | A * | 8/1998 | Hewitt | G06F 3/16 327/270 |
| 7,249,272 | B1 * | 7/2007 | Wardrop | H04J 3/0644 709/237 |
| 2006/0045215 | A1 * | 3/2006 | Ballantyne | G04G 3/00 375/344 |
| 2013/0013254 | A1 * | 1/2013 | Bang | G04F 10/005 702/178 |
| 2014/0327573 | A1 * | 11/2014 | Leibner | G01S 19/215 342/357.59 |
| 2016/0239010 | A1 * | 8/2016 | McDaniel | H02J 3/00 |

* cited by examiner

*Primary Examiner* — Akm Zakaria
(74) *Attorney, Agent, or Firm* — Hunton Andrews Kurth LLP (57) ABSTRACT

Embodiments of the present invention may provide a device for monitoring electric power at the distribution level. The device may include an analog-to-digital converter (ADC) to convert an input signal into digital samples at time intervals, a receiver to generate a pulse-per-second (PPS) signal, an oscillator to generate an oscillator signal, and a data processor coupled to the ADC, the receiver, and the oscillator. The data processor may include a counter to measure an oscillator frequency of the oscillator signal at each pulse of the PPS signal, an adjuster to adjust a timer period register value, and a timer to adjust the time intervals based on the adjusted timer period register value. Based on the digital samples, the data processor may generate a plurality of metrics, which may include one or more measurements of frequency, magnitude, phase, harmonic level, signal-to-noise ratio, sag, and swell of the input signal.

20 Claims, 9 Drawing Sheets

UNIVERSAL GRID ANALYZER

STATEMENT REGARDING FEDERALLY SPONSORED RESEARCH OR DEVELOPMENT

This invention was made with government support under EEC1041877 awarded by the National Science Foundation (NSF). The government has certain rights in the invention.

BACKGROUND

The present invention generally relates to methods and devices for monitoring electric power systems.

Increasing concerns about the environmental impact of electricity production have led to increased, but dispersed, penetration of renewable energy sources into the power grid. Many of these renewable energy sources are installed at the distribution level of the power grid. The stochastic nature of renewable energy sources, such as solar and wind, and the lack of visibility of the power generated by these sources negatively affect power system operators' situational awareness. In other words, due to the lack of continuous, fast, and accurate monitoring of these renewable energy sources, the power system operators' ability to interpret the present operation state and forecast the upcoming operation state of the power grid becomes problematic. Additionally, renewable energy sources are usually coupled to the power grid via power converters, which tend to affect the power quality of the power grid. As the power quality worsens, the power grid may get less stable and some customer loads may be damaged.

A phasor measurement unit (PMU) is an example of a situational awareness tool capable of providing real-time, global positioning system (GPS) time-synchronized measurements of power grid. However, traditional PMUs are installed at the transmission level, at high voltage substations, and provide limited measurements such as voltage, current, frequency, and phase angle. Moreover, traditional PMUs do not provide information about the quality of the power being transmitted.

Therefore, the inventors recognized a need in the art for accurately monitoring power at the distribution level.

BRIEF DESCRIPTION OF THE DRAWINGS

The present invention will become more fully understood from the detailed description given below and from the accompanying drawings. The drawings are intended to disclose but a few possible examples of the present invention, and thus do not limit the present invention's scope.

DETAILED DESCRIPTION

Embodiments of the present invention may provide a device for monitoring electric power at the distribution level. The device may include an analog-to-digital converter (ADC) to convert an input signal into digital samples at time intervals, a receiver to generate a pulse-per-second (PPS) signal, an oscillator to generate an oscillator signal, and a data processor coupled to the ADC, the receiver, and the oscillator. The data processor may include a counter to measure an oscillator frequency of the oscillator signal at each pulse of the PPS signal, an adjuster to adjust a timer period register value, and a timer to adjust the time intervals based on the adjusted timer period register value. Based on the digital samples, the data processor may generate a plurality of metrics, which may include one or more measurements of frequency, magnitude, phase, harmonic level, signal-to-noise ratio, sag, and swell of the input signal.

Embodiments of the present invention may provide a device for providing high-precision synchronous sampling. The device may include a first input to receive an oscillator signal from an oscillator, a second input to receive a PPS signal from a receiver, an output coupled to an ADC, a counter to measure an oscillator frequency of the oscillator signal at each pulse of the PPS signal, an adjuster to adjust a timer period register value based on the oscillator frequency and a sampling rate of the device, and a timer to adjust time intervals based on the adjusted timer period register value, wherein the ADC converts an input signal into digital samples at the time intervals.

Embodiments of the present invention may provide a method for monitoring electric power at the distribution level. The method include converting an input signal into digital samples at time intervals, and adjusting the time intervals based on a PPS signal generated by a receiver. The method may adjust the time intervals by measuring an oscillator frequency of an oscillator, and adjusting a timer period register value based on the oscillator frequency and a sampling rate. The method may measure the oscillator frequency by receiving an oscillating signal from the oscillator, receiving the PPS signal from the receiver, and counting a number of cycles of the oscillating signal between two consecutive pulses of the PPS signal. The method may further include storing the digital samples in a data queue module, and generating a plurality of metrics based on the digital samples stored in the data queue module, wherein the plurality of metrics may include one or more measurements of frequency, magnitude, phase, harmonic level, signal-to-noise ratio, sag, and swell of the input signal.

Figure 1:
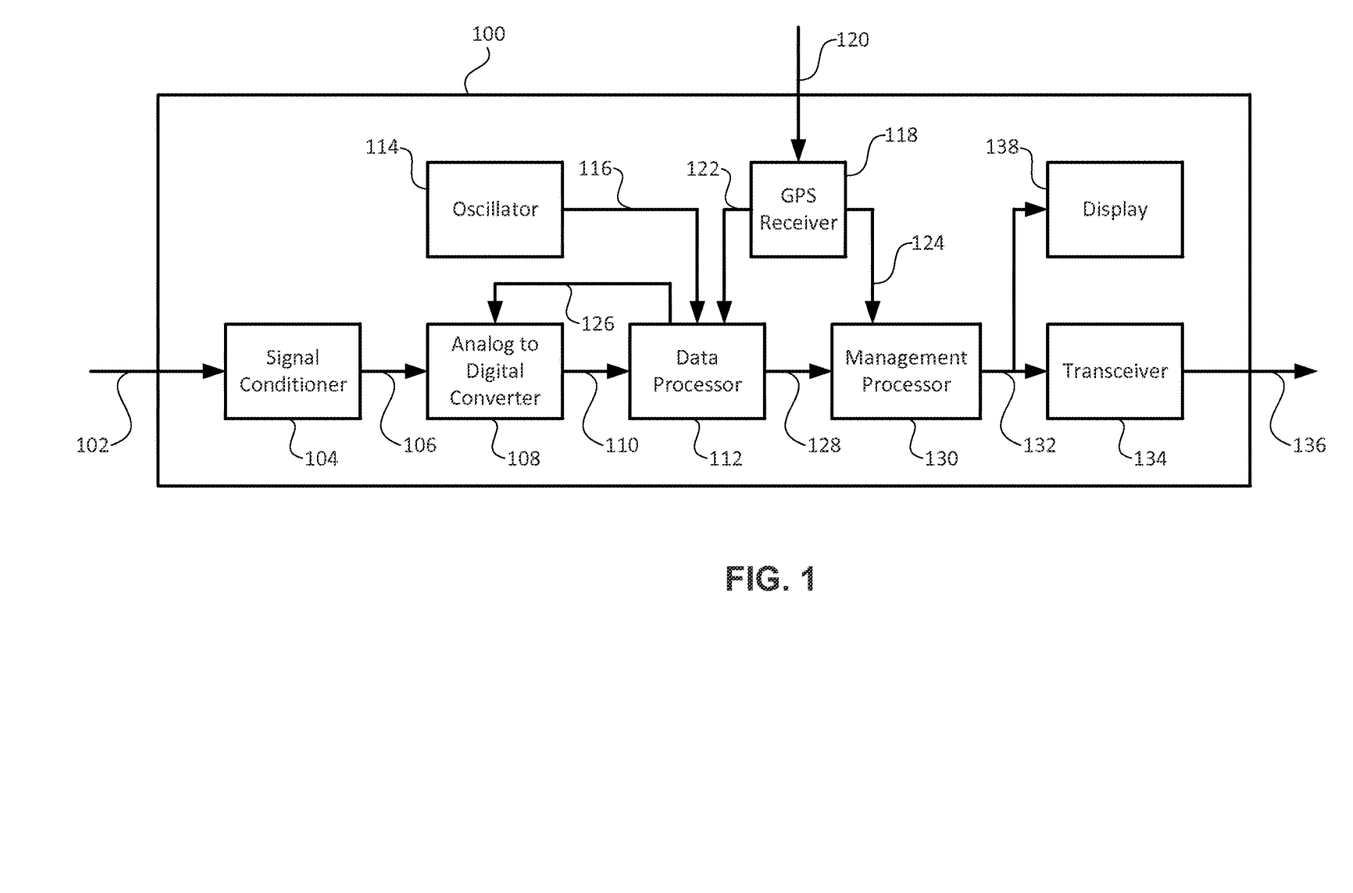
FIG. 1 illustrates a block diagram of a universal grid analyzer in accordance with certain embodiments of the present invention.

FIG. 1 illustrates a block diagram of a universal grid analyzer (UGA) 100 according to an embodiment of the present invention. The UGA 100 may include a signal conditioner 104, an analog to digital converter (ADC) 108, a data processor 112, an oscillator 114, a global positioning system (GPS) receiver 118, a management processor 130, a transceiver 134, and a display 138. The data processor 112, the management processor 130, and the transceiver 134 may be either separate processors or part of a single processor.

The signal conditioner 104 may receive an input signal 102 and may generate a scaled signal 106, by reducing the magnitude of the input signal 102 to a level that is within the allowable input range of the ADC 108. The signal conditioner 104, for example, may include an operational amplifier. An example of the input signal 102 may be a single-phase 120-V 60-Hz alternating-current (AC) voltage from a conventional outlet. The ADC 108 may receive the scaled signal 106 and may generate a digital signal 110, which includes a plurality of digital samples at time intervals.

The data processor 112 may receive the digital signal 110 and generate a plurality of metrics 128, which may include, but are not limited to, measurements of frequency, magnitude, phase, harmonic level, signal-to-noise ratio (SNR), sag, and swell of the input signal 102. The data processor 112 may also receive an oscillator signal 116 from the oscillator 114 and a pulse-per-second (PPS) signal 122 from the GPS receiver 118, which may receive a GPS signal 120 from a GPS antenna (not shown). One skilled in the art would appreciate that the generation of the PPS signal 122 is not limited to the GPS receiver 118. For example, the PPS signal 122 may also be generated by using a chip scale atomic clock (CSAC), other navigational systems such as Enhanced Long-Range Navigation (eLoran), or a network time protocol (NTP). Based on an oscillator frequency $f_{osc}$ of the oscillator signal 116, the PPS signal 122, and a sampling rate $F_s$ of the UGA 100, the data processor 112 may generate a sampling control command 126. The data processor 112 may send the sampling control command 126 to the ADC 108 to adjust the time intervals at which the ADC 108 may generate the digital samples of the digital signal 110. The function of the data processor 112 will be discussed in detail with respect to FIG. 3.

The management processor 130 may receive the plurality of metrics 128 from the data processor 112 and a timestamp signal 124 from the GPS receiver 118. Based on the timestamp signal 124, the management processor 130 may time stamp the plurality of metrics 128, generating an output dataset 132. The management processor 130 may send the output dataset 132 to the transceiver 134, which may transmit the output dataset 132 as a transmitted signal 136 to a remote location, such as, but not limited to, a data center or a grid operation center. For example, the transmitted signal 136 may be transmitted via wired and/or wireless connection. A display 138 may display the output dataset 132 received from the management processor 130. In an embodiment, some components such as the transceiver 134 and the display 138 may be provided external to and coupled to the UGA 100.

Figure 2:
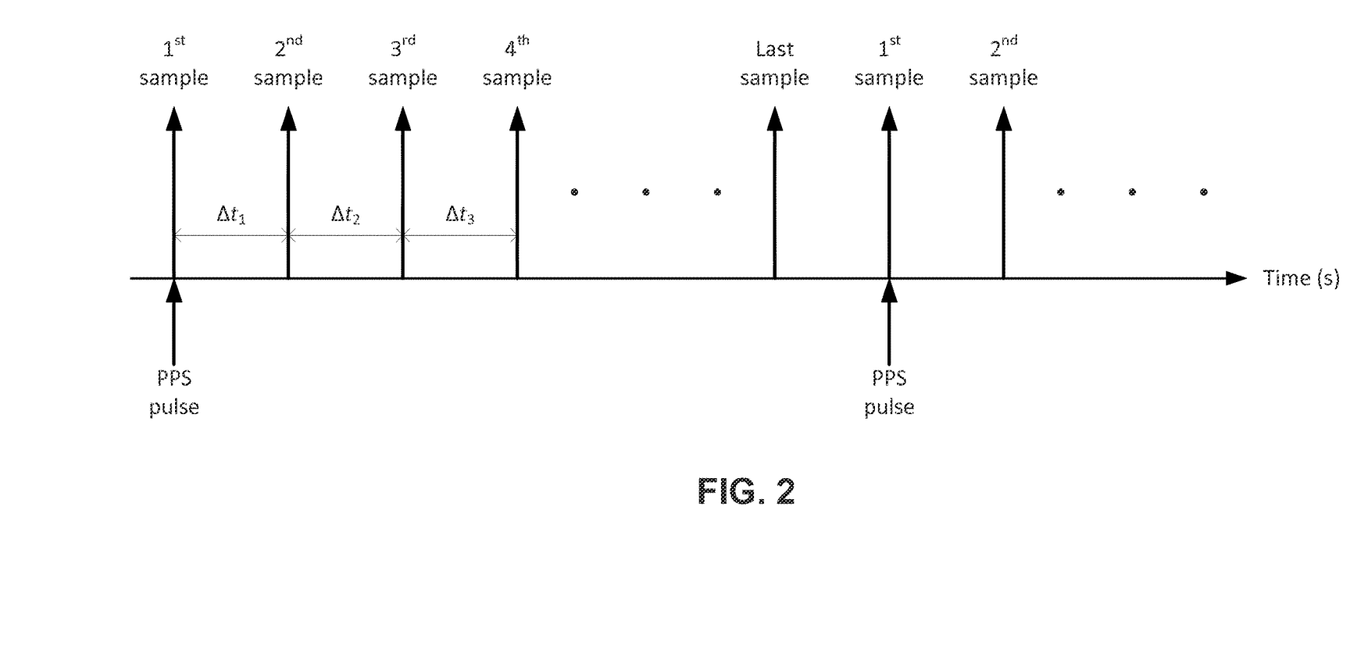
FIG. 2 illustrates a concept of synchronous sampling in accordance with certain embodiments of the present invention.

The UGA 100 may provide time-synchronized high-precision metrics. As mentioned, the plurality of metrics 128 may be time-synchronized using the GPS receiver 118. The precision of the plurality of metrics 128 may depend on the precision of the synchronous sampling of the UGA 100. Synchronous sampling implies that the digital samples generated by the ADC 108 be synchronized to a reference time. FIG. 2 illustrates the concept of synchronous sampling according to an embodiment of the present invention. FIG. 2 illustrates an example of the timing of the digital samples of the digital signal 110 between two subsequent pulses of the PPS signal 122, from a first digital sample to a last digital sample. Since pulses of PPS signals from GPS receivers are aligned to the Coordinated Universal Time (UTC) and consistent among GPS receivers in different geographic locations, the pulses may be used to synchronize the first digital samples. In other words, every second, the first digital samples from multiple UGAs may always be aligned with a pulse of the PPS signal and, therefore, with one another. Based on the PPS signal 122 received from the GPS receiver 118, the data processor 112 may be configured to trigger the ADC 108 to sample every first digital sample to coincide with every pulse of the PPS signal 122.

The data processor 112 may further be configured to enforce synchronization of the second sample through the last digital sample by adjusting the time intervals between consecutive digital samples. The time intervals may be represented by $$\Delta t_{i-1} = \frac{N_i}{f_{osc}}, \; i = 2, \ldots, F_s \qquad (1)$$

where $\Delta t_{i-1}$ is the time interval between the $(i-1)^{th}$ sample and the $i^{th}$ sample, $N_i$ is a value of a timer period register of the data processor 112, $f_{osc}$ is the oscillator frequency of the oscillator signal 116, and $F_s$ is the sampling rate of the UGA 100. Therefore, based on equation (1), to adjust the time intervals, the data processor 112 may be configured to determine the oscillator frequency $f_{osc}$ and the timer period register value $N_i$.

Figure 3:
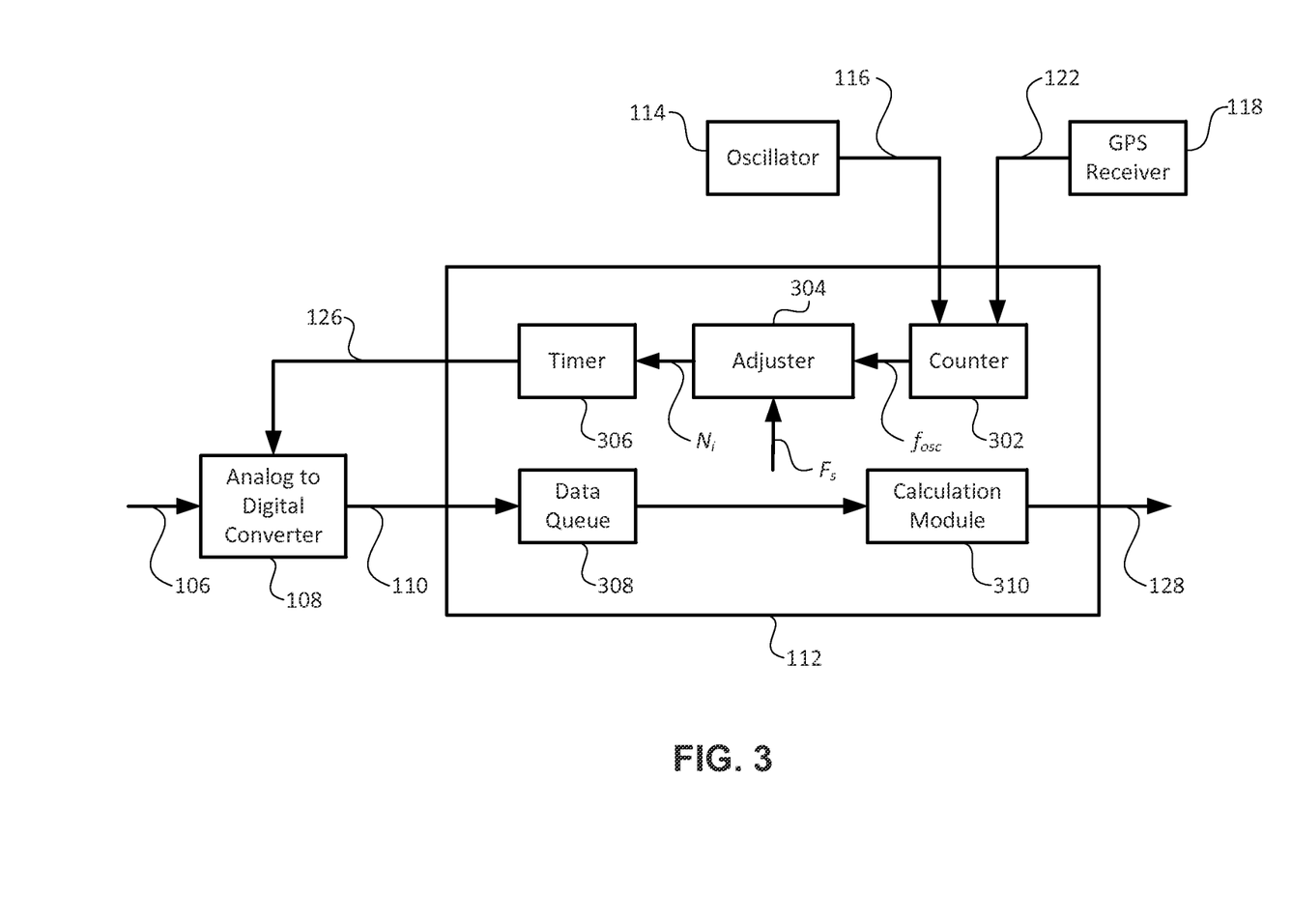
FIG. 3 illustrates a block diagram of a data processor in accordance with certain embodiments of the present invention.
Figure 4:
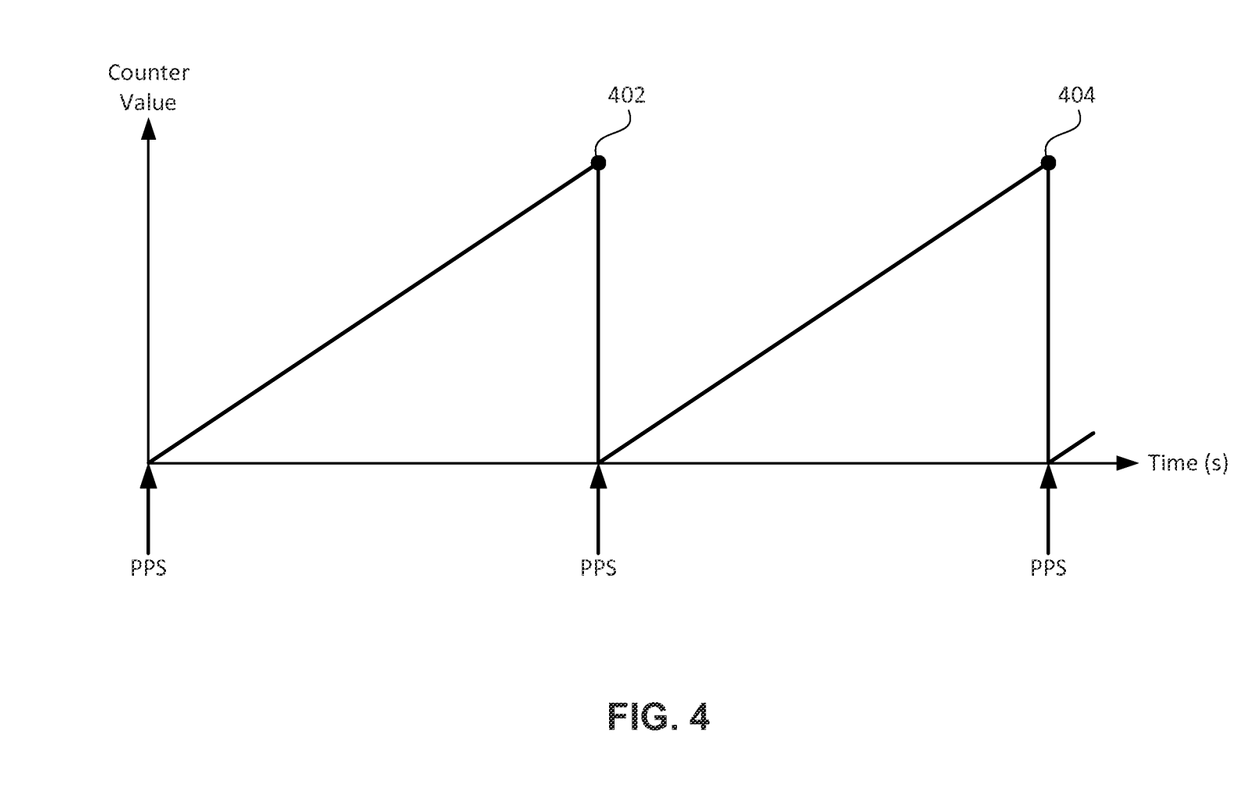
FIG. 4 illustrates a measurement technique of an oscillator frequency of an oscillator in accordance with certain embodiments of the present invention.

As illustrated in FIG. 3, according to an embodiment of the present invention, the data processor 112 may include a counter 302, an adjuster 304, and a timer 306. The counter 302 may receive the oscillator signal 116 from the oscillator 114 and the PPS signal 122 from the GPS receiver 118. The counter 302 may count, in real time, the number of cycles of the oscillator signal 116 between every consecutive pulses of the PPS signal 122, as illustrated by the counter value in FIG. 4. As such, the counter may determine the oscillator frequency $f_{osc}$ based on the counter value at the end of the period between two consecutive pulses of the PPS signal 122, as shown for example by points 402 and 404 in FIG. 4. By determining the oscillator frequency $f_{osc}$ as described, the oscillator frequency $f_{osc}$ may be measured and updated every second in real time, and thus eliminating (or greatly reducing) the adverse effects that aging and drifting of the oscillator 114 can have on the sampling accuracy of the UGA 100.

In FIG. 3, the adjuster 304 may receive the oscillator frequency $f_{osc}$ from the counter 302 and the sampling rate $F_s$ to adjust the timer period register value $N_i$. Ideally, the timer period register value $N_i$ may be represented by:

$$N_{ideal} = \frac{f_{osc}}{F_s} \qquad (2)$$

Equation (2) implies that it is possible for $N_i$ to be a non-integer value. However, since $N_i$ is a discrete parameter of the timer period register of the timer 306, $N_i$ must be an integer. The adjuster 304 may be configured to make $N_i$ approach $N_{ideal}$ by making $N_i$ vary between two consecutive integers, based on the following formulation:

$$N_i = \begin{cases} N_L \begin{pmatrix} if \left| \sum_{k=2}^{i-1}(N_k) + N_L - (i-1)N_{ideal} \right| < \\ \left| \sum_{k=2}^{i-1}(N_k) + N_H - (i-1)N_{ideal} \right| \end{pmatrix}, & i \geq 3 \\ N_H \begin{pmatrix} if \left| \sum_{k=2}^{i-1}(N_k) + N_L - (i-1)N_{ideal} \right| \geq \\ \left| \sum_{k=2}^{i-1}(N_k) + N_H - (i-1)N_{ideal} \right| \end{pmatrix}, & i \geq 3 \\ \text{round}\left(\dfrac{f_{osc}}{F_s}\right), & i = 2 \end{cases} \quad (3)$$

where $$N_L = \text{floor}\left(\dfrac{f_{osc}}{F_s}\right) \quad (4)$$

$$N_H = \text{ceil}\left(\dfrac{f_{osc}}{F_s}\right) \quad (5)$$

The "round" function in equation (3) rounds a real number to the nearest integer. The "floor" function in equation (4) maps a real number to the smallest following integer. The "ceil" function in equation (5) maps a real number to the largest previous integer. This formulation may guarantee that, on average, the timer period register value $N_i$ is equal to $N_{ideal}$, and the time interval between two consecutive digital samples is equal to $1/F_s$.

Figure 5:
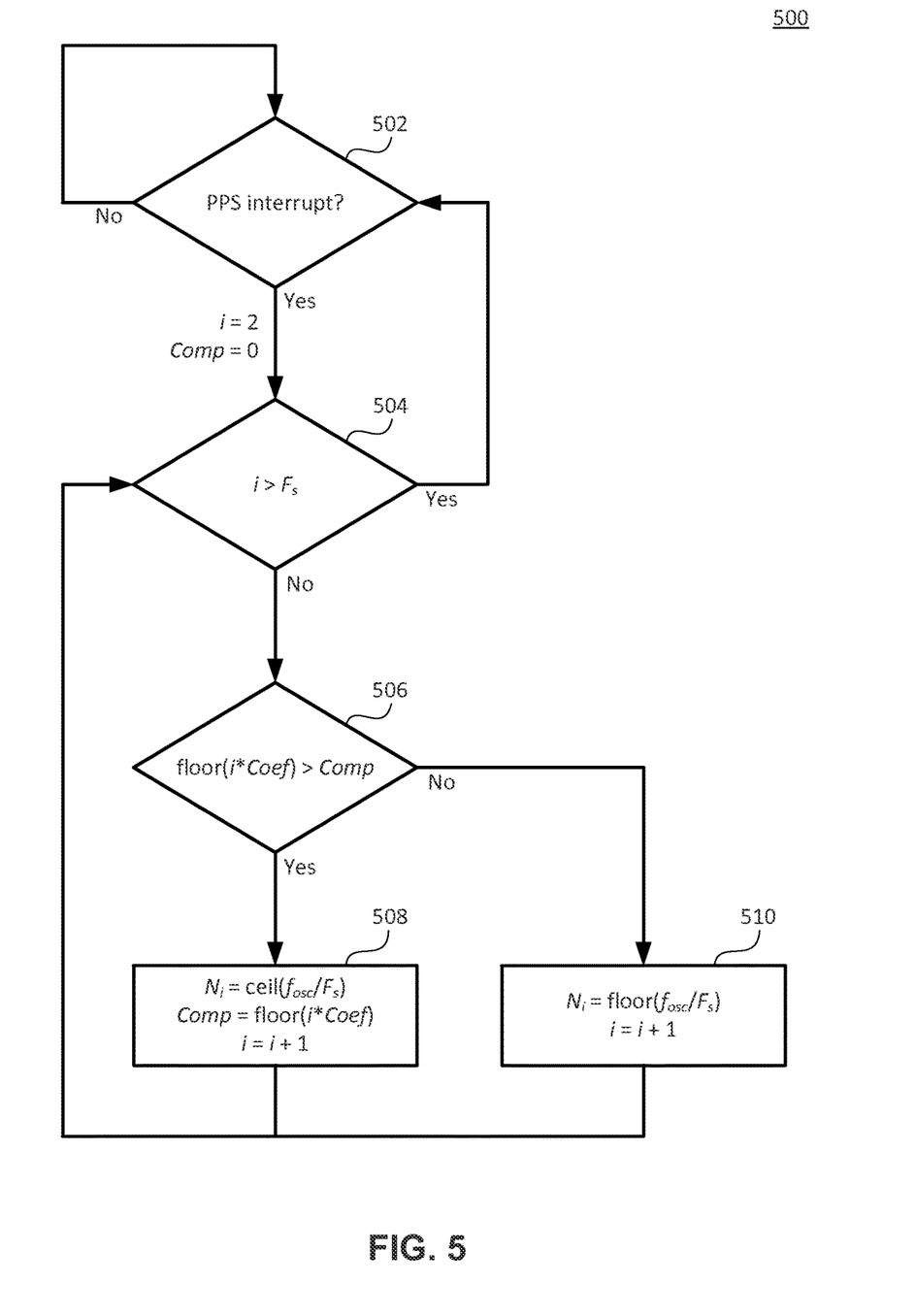
FIG. 5 illustrates a method for computing a timer period register value in accordance with certain embodiments of the present invention.

Alternatively, the adjuster 304 may be configured to adjust the timer period register value $N_i$ using a method 500 illustrated in FIG. 5, according to an embodiment of the present invention. The method 500 begins in step 502, wherein the method 500 waits for a PPS interrupt, which corresponds to a pulse of the PPS signal 122. If there is PPS interrupt, the method 500 sets i to 2 and a comparison parameter Comp to zero, and moves to step 504. In step 504, the method 500 checks if i is greater than $F_s$, the sampling rate of the UGA 100. If i is greater than $F_s$, the method 500 loops back to step 502 and waits for the next PPS interrupt. If i is smaller than $F_s$, the method 500 moves to step 506, wherein floor(i*Coef) is compared to Comp. The variable Coef is calculated by:

$$Coef = \dfrac{f_{osc}}{F_s} - \text{floor}\left(\dfrac{f_{osc}}{F_s}\right) \quad (6)$$

If floor(i*Coef) is greater than Comp, the method 500 proceeds to step 508; otherwise, the method 500 proceeds to step 510. In step 508, the method 500 sets $N_i$ to ceil($f_{osc}/F_s$), Comp to floor(i*Coef), and increments i. In step 510, the method 500 sets $N_i$ to floor($f_{osc}/F_s$) and increments i. Once either step 508 or step 510 is completed, the method 500 loops back to step 504.

Referring back to FIG. 3, the timer 306 may receive the timer period register value $N_i$ as determined by the adjuster 304, and generate the sampling control command 126 to be sent to the ADC 108. The ADC 108 may then generate the digital samples that are time-synchronized and highly precise. The ADC 108 may send the digital samples as the digital signal 110 to the data processor 112. The data processor 112 may further include a data queue module 308 and a calculation module 310. The digital samples received by the data processor 112 are stored in the data queue module 308.

The calculation module 310 may generate a plurality of metrics based on the digital samples stored in the data queue module 308. For example, the calculation module 310 may determine whether there is a sag or a swell in the input signal 102, as defined by the IEC 61000-4-30 standard, for example. The calculation module 310 may also compute the root mean square (RMS) value of the input signal 102. In the case where the input signal 102 is a single-phase 120-V 60-Hz AC voltage from a conventional outlet voltage, the RMS voltage may be calculated every half of a fundamental cycle (i.e., 1/120 s) and represented by:

$$U_{RMS} = \sqrt{\dfrac{1}{N_{RMS}} \sum_{n=1}^{N_{RMS}} x(n)^2} \quad (7)$$

where x(n) represents a sample of the input signal 102 and $N_{RMS}$ is the number of samples used to calculate $U_{RMS}$, and is equal to half of number of samples in one fundamental cycle. The sliding window for calculating the RMS voltage $U_{RMS}$ is equal to $N_{RMS}$. In other words, the RMS voltage $U_{RMS}$ is calculated 120 times in a second for a 60-Hz power grid. Flags may be used to indicate the occurrence of a sag or a swell. For example, each sag flag and swell flag may be represented by one byte, wherein the first two bits of each byte may be starting bits and set to 11. Therefore, following the first two bits are six bits indicating the occurrence of a sag or a swell. A bit 0 may indicate that there is no sag or swell, while a bit 1 may indicate that there is a sag or a swell.

Figure 6:
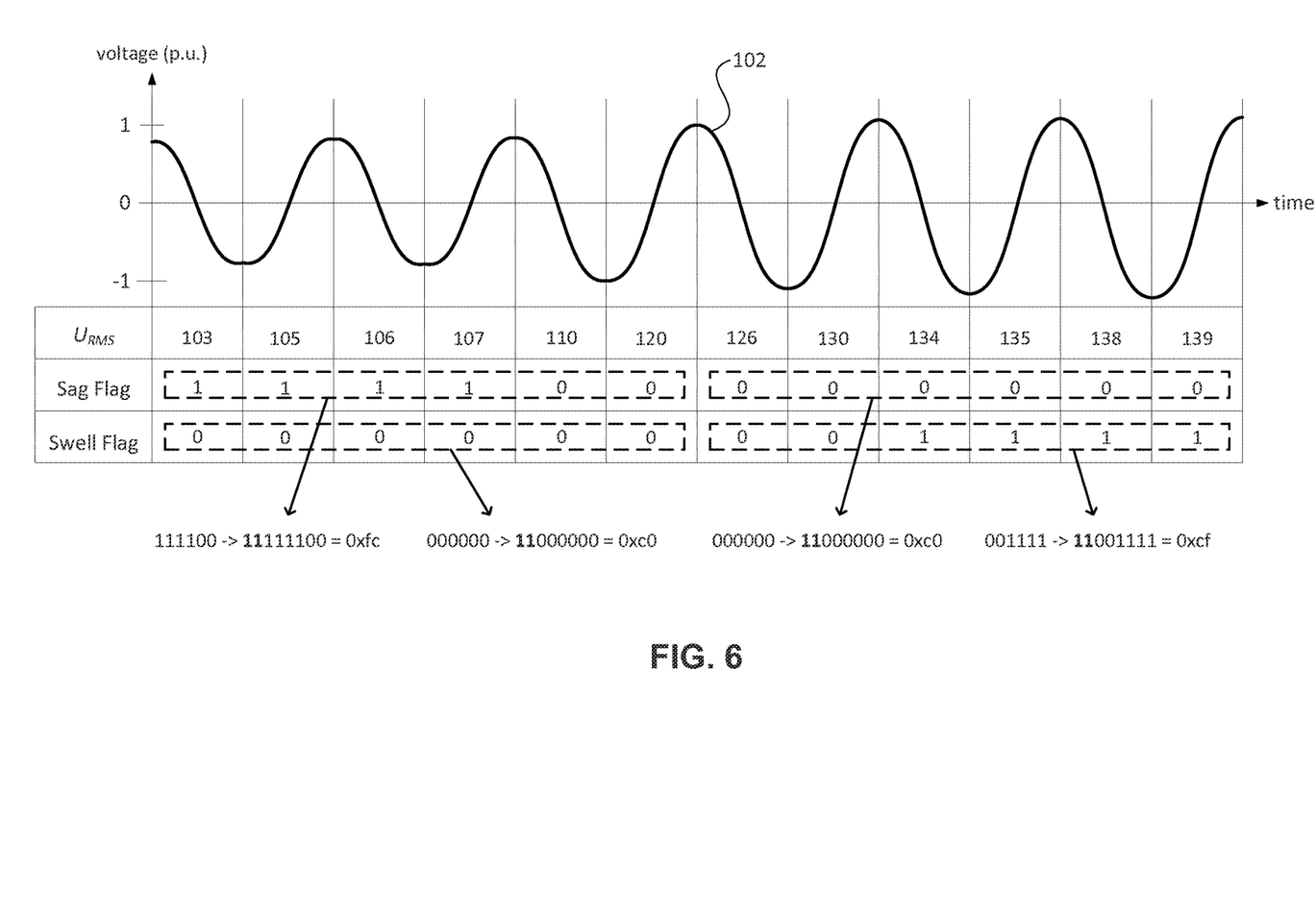
FIG. 6 illustrates an exemplary input signal, along with RMS values, sag flags and swell flags in accordance with certain embodiments of the present invention.

According to an embodiment of the present invention, FIG. 6 illustrates an exemplary input signal 102, representative of a single-phase 120-V 60-Hz AC voltage, along with the RMS voltage $U_{RMS}$ for each half of a fundamental cycle, sag flags, and swell flags. FIG. 6 shows six fundamental cycles of the input signal 102. In this example, the nominal RMS voltage is 120 V, the sag threshold is 110 V, and the swell threshold is 130 V. When the RMS voltage $U_{RMS}$ in half of a fundamental cycle is less than the 110-V sag threshold, the sag flag bit is set to 1, otherwise the sag flag bit is set to 0. When the RMS voltage $U_{RMS}$ in half of a fundamental cycle is greater than the 130-V swell threshold, the swell flag bit is set to 1, otherwise the swell flag bit is set to 0. As shown in FIG. 6, during the six fundamental cycles, the two sag flags are 0xfc and 0xc0 while the two swell flags are 0xc0 and 0xcf.

According to an embodiment of the present invention, the calculation module 310 may further include a harmonic measurement algorithm to measure the harmonic levels of the input signal 102. The harmonic measurement algorithm may be implemented using a modified periodogram method, for example. The modified periodogram method may be adopted to calculate a power spectral density (PSD) of the input signal 102 in a frequency domain. The equation used to calculate the PSD is given by:

$$P_{xx}\left(\dfrac{k}{N}\right) = \dfrac{1}{N} \left| \sum_{N=0}^{N-1} h(n)x(n)e^{-j2\pi nk/N} \right|^2, \quad k = 0, 1, \ldots, N-1 \quad (8)$$

where N is the window size of the modified periodogram, x(n) represents a sample of the input signal 102, h(n) are the coefficients of the window, and a Kaiser window with β=38 may be used. h(n) may be computed by:

$$h(n) \triangleq \begin{cases} \dfrac{I_0\left(\beta\sqrt{1-\left(\dfrac{n}{\frac{N}{2}}\right)^2}\right)}{I_0(\beta)}, & -\dfrac{N-1}{2} \leq n \leq \dfrac{N-1}{2} \\ 0 \end{cases} \quad (9)$$

where $I_0$ is the zeroth-order Modified Bessel function of the first kind. The frequency resolution of the modified periodogram is $F_s/N$. In the UGA 100, if an exemplary length of the window is 0.5 second, then N is equal to $F_s/2$ and the frequency resolution is 2 Hz. As a result, the power of $i^{th}$ order of harmonic component may be obtained by substituting k with (30i+1) in equation (8).

According to an embodiment of the present invention, the calculation module 310 may further include a noise analysis function. For example, the calculation module 310 may compute a signal-to-noise ratio (SNR) of the input signal 102 as $$SNR = \frac{P_{signal}}{P_{noise}} \quad (9)$$

where $P_{signal}$ is the power of the fundamental frequency component in the input signal 102, and $P_{noise}$ is the power of the noise in the input signal 102. $P_{noise}$ includes all frequency components except the fundamental frequency component and the harmonic components.

Figure 7:
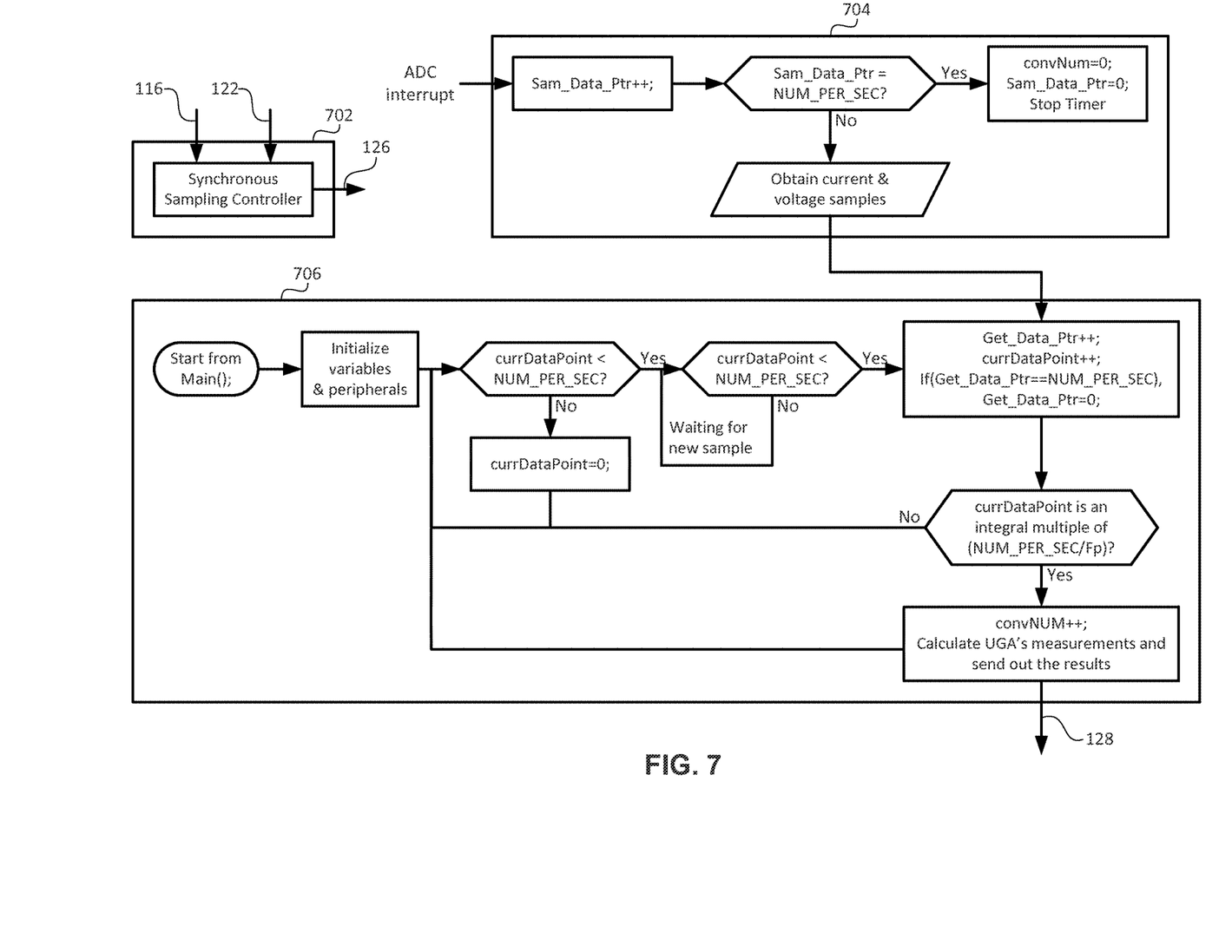
FIG. 7 illustrates an operation of a data processor in accordance with certain embodiments of the present invention.

As discussed, the data processor 112 may, among other things, synchronize sampling of the digital samples of the digital signal 110 and generate the plurality of metrics 128. According to an embodiment of the present invention, the operation of the data processor 112 may comprise three routines as shown in FIG. 7: a PPS interrupt routine 702, an ADC interrupt routine 704, and a main routine 706. The PPS interrupt routine 702 dictates the synchronous sampling of the digital samples generated by the ADC 108 by generating the sampling control command 126 based on the oscillator signal 116 and the PPS signal 122. The ADC interrupt routine 704 may dictate the generation of the digital samples by the ADC 108. The ADC interrupt routine 704 may start by incrementing a sample sequence counter Sam_Data_Ptr, followed by a judgment as to whether or not the sample sequence counter Sam_Data_Ptr is equal to a parameter NUM_PER_SEC, which may represent the number of samples in one second or the sampling rate $F_s$. If the sample sequence counter Sam_Data_Ptr is equal to the parameter NUM_PER_SEC, the ADC interrupt routine 704 may reset a counter variable convNum and the sample sequence counter Sam_Data_Ptr, indicating an upcoming pulse of the PPS signal 122. The timer to trigger the ADC 108 may also be stopped in anticipation of the upcoming PPS pulse. If the sample sequence counter Sam_Data_Ptr is not equal to the parameter NUM_PER_SEC, the ADC interrupt routine may generate the digital samples from the scaled signal 106, and make the digital samples available to the main routine 706.

The main routine 706 may start by initializing variables and peripherals. The main routine 706 may comprise a loop that compares a variable Get_Data_Ptr, which points to the current sample saved in the data processor, a counter currDataPoint, which represents the current sample captured by the ADC interrupt routine 704. The loop of the main routine 706 may repeat if the variable Get_Data_Ptr is equal to the counter currDataPoint. The loop may terminate only if the variable Get_Data_Ptr is not equal to the counter currDataPoint. Once the loop stops, the main may execute a series of operations, including the generation of the plurality of metrics 128. The main routine 706 may send the plurality of metric 128 to the management processor 130 when the counter currDataPoint is an integral multiple of (NUM_PER_SEC/Fp), wherein Fp represents the measurement rate of the UGA 100 in one second. Once the main routine 706 completes the series of operations, the main routine 706 may loop back and wait for a new digital sample, preceded by resetting the counter currDataPoint if it is not less than the parameter NUM_PER_SEC. The counter currDataPoint is used to coordinate the pace between the measurement function in the main routine 706 and the ADC interrupt routine 704.

Figure 8:
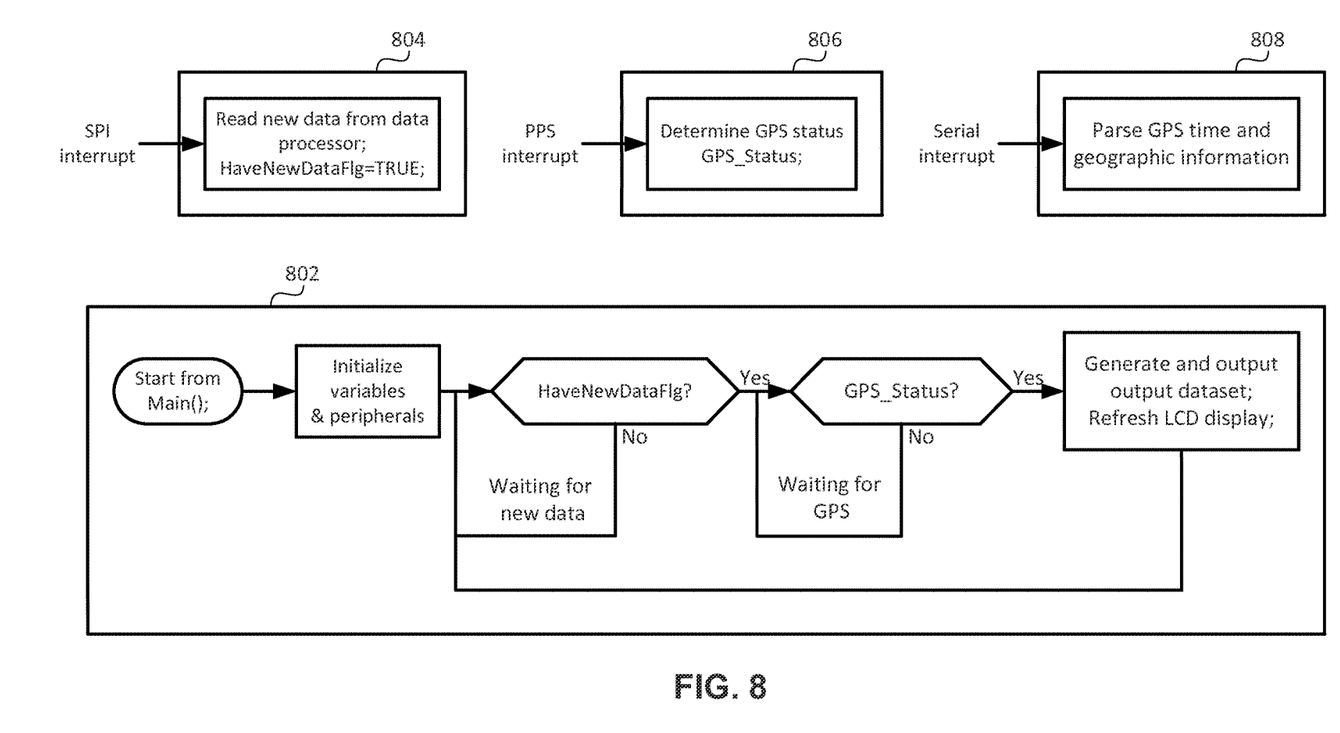
FIG. 8 illustrates an operation of a management processor in accordance with certain embodiments of the present invention.

Referring back to FIG. 1, once the management processor 130 receives the plurality of metrics 128 from the data processor 112, the management processor 130 may parse timing information from the timestamp signal 136 from the GPS receiver 118, time stamp the plurality of metrics 128 to generate the output dataset 132, and transmit the output dataset 132 to the transceiver 134. According to an embodiment of the present invention, the operation of the management processor 130 is illustrated in FIG. 8. The main routine 802 of the management processor 130 may start with initializing the variables and peripherals before repeating an infinite loop. The infinite loop may check the status of a HaveNewDataFlg variable, which is set by a Serial Peripheral Interface (SPI) interrupt routine 804 upon arrival of a new set of plurality of metrics 128 from the data processor 112. There is another infinite loop to wait for the recovery of the GPS signal information based on the GPS routine 806. When the HaveNewDataFlg variable is refreshed by the SPI interrupt routine 804 and GPS_Status is set to be ready by the GPS routine 806, the main routine 802 may parse GPS time and geographic information by a parsing routine 808 and generate a new output dataset 132. The output dataset 132 may then be outputted, for example, by being displayed on the display 138 and/or being sent to the transceiver 134, which may in turn transmit the output dataset 132 to a remote location, such as, but not limited to, a data center or a grid operation center.

Figure 9:
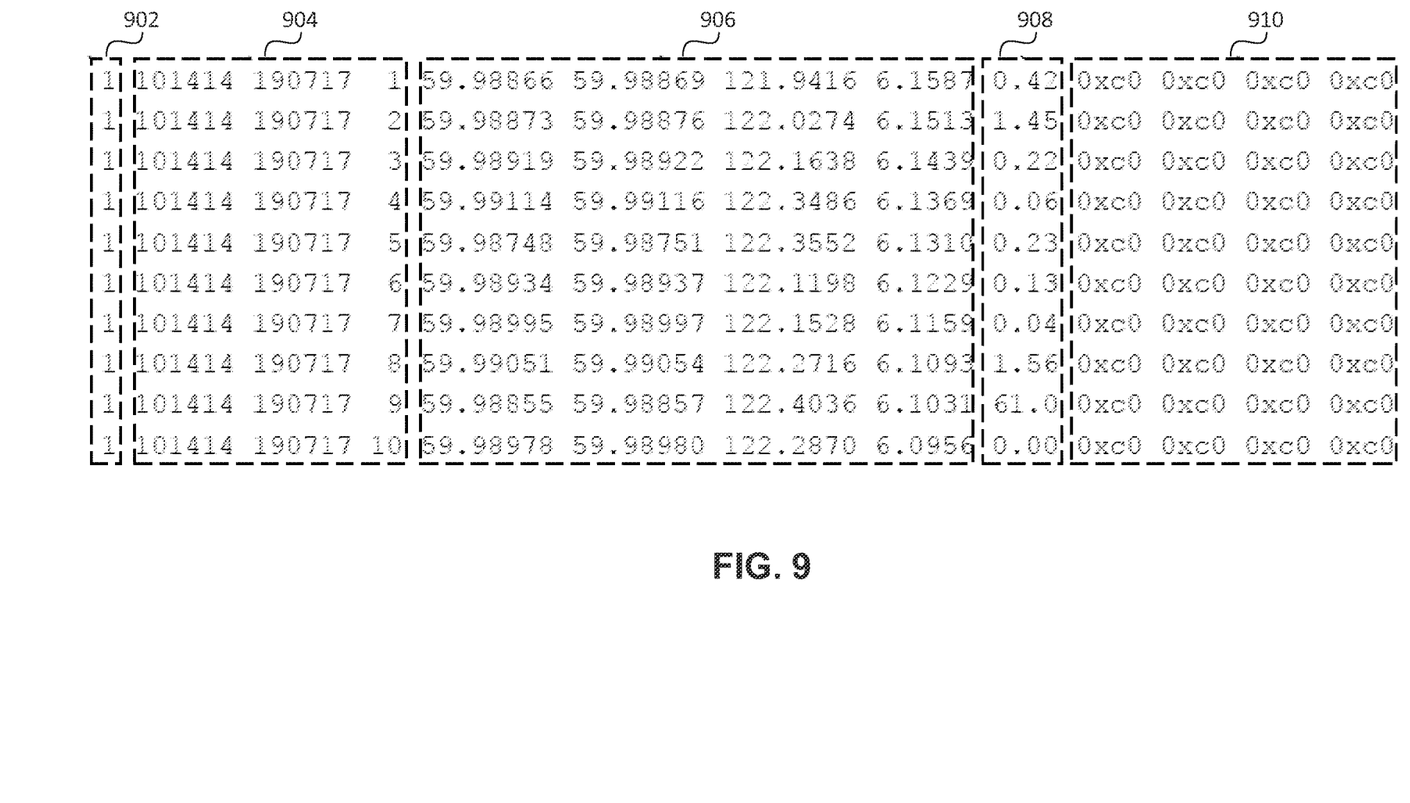
FIG. 9 illustrates an exemplary output dataset of a universal grid analyzer in accordance with certain embodiments of the present invention.

According to an embodiment of the present invention, an example of the output dataset 132 of the UGA 100 is shown in FIG. 9. In this example, the input signal 102 is a single-phase 120-V 60-Hz AC voltage and the output data rate is 10 samples per second. The data frame may be divided into five segments. The first segment 902 may be the UGA 100's unique identification number, which is "1" in this example. The second segment 904 may be the time information based on the timestamp signal 124. For example, 101414 190717 1 represents Oct. 14, 2014 at 19:07:17.1. The third segment 906 may represent the phasor measurement metrics, with four columns representing a first frequency, a second frequency, a voltage magnitude, and a phase angle, respectively. During each calculation period, the frequency may be computed twice to improve accuracy of the frequency measurement. The fourth segment 908 may include harmonic levels, a total harmonic distortion (THD), and the SNR. In the fourth segment 908, the first eight data frames of one-second data may include $3^{rd}$, $5^{th}$, $7^{th}$, $9^{th}$, $11^{th}$, $13^{th}$, $15^{th}$ order of harmonic level and THD, respectively. The 9th data frame may represent the SNR, and the last data frame may be reserved. As shown in FIG. 9, the $3^{rd}$, $5^{th}$, $7^{th}$, $9^{th}$, $11^{th}$, $13^{th}$ and $15^{th}$ order of harmonics are 0.42%, 1.45%, 0.22%, 0.06%, 0.23%, and 0.04%, respectively, the THD is 1.56%, and SNR is 61.0 dB. The fifth segment 910 may represent the sag and swell flags. The first two columns may be sag flags, and the last two columns may be swell flags. Since there are six fundamental frequency cycles in every 0.1 second and the voltage magnitude is calculated 12 times in this period for a single-phase 120-V 60-Hz AC voltage, two bytes are needed to indicate the status of each of sag and swell flags every 0.1 second.

It should be understood that there exist implementations of other variations and modifications of the invention and its various aspects, as may be readily apparent to those of ordinary skill in the art, and that the invention is not limited by specific embodiments described herein. Features and embodiments described above may be combined with and without each other. It is therefore contemplated to cover any and all modifications, variations, combinations or equivalents that fall within the scope of the basic underlying principals disclosed and claimed herein.

What is claimed is:

1. A device, comprising:
    an analog-to-digital converter (ADC) to convert an input signal into digital samples, wherein the ADC is configured to receive the input signal from a power grid;
    a receiver to generate a pulse-per-second (PPS) signal, wherein the ADC is configured to convert the input signal into the digital samples at each of a plurality of sampling times, the plurality of sampling times being distributed between two consecutive PPS signals;
    an oscillator to generate an oscillator signal having an oscillator frequency ($f_{osc}$); and
    a data processor coupled to the ADC, the receiver, and the oscillator, wherein the data processor is configured to:
        receive the oscillator frequency and a sampling rate ($F_s$) and calculate an ideal timer period register value ($N_{ideal}$) which is a number of cycles of oscillator signal between two sampling times;
        calculate a timer period register value ($N_i$) for each two consecutive sampling times distributed between two consecutive PPS signals, the timer period register value ($N_i$) for a period between an (i-1) and an ith sample is determined by:

$$N_i = \begin{cases} N_L & \left( \text{if } \left| \sum_{k=2}^{i-1}(N_k) + N_L - (i-1)N_{ideal} \right| < \left| \sum_{k=2}^{i-1}(N_k) + N_H - (i-1)N_{ideal} \right| \right) \\ N_H & \left( \text{if } \left| \sum_{k=2}^{i-1}(N_k) + N_L - (i-1)N_{ideal} \right| \geq \left| \sum_{k=2}^{i-1}(N_k) + N_H - (i-1)N_{ideal} \right| \right), \quad i \geq 3 \\ \text{round}\left(\frac{f_{osc}}{F_s}\right), & i = 2 \end{cases}$$

where $N_L = \text{floor}\left(\frac{f_{osc}}{F_s}\right)$ and $N_H = \text{ceiling}\left(\frac{f_{osc}}{F_s}\right)$, and
    the first sample is taken at the PPS signal;
    adjust the sampling times based on the timer period register value ($N_i$) to minimize deviation from the ideal timer period register value ($N_{ideal}$);
    sample the input signal at each adjusted sampling time; and
    generate a plurality of metrics based on the digital samples.

2. The device of claim 1, further comprising:
    an input coupled to an outlet to receive the input signal from the outlet, wherein the plurality of metrics include one or more measurements of frequency, magnitude, phase, harmonic level, signal-to-noise ratio, sag, and swell of the input signal.

3. The device of claim 1, wherein the data processor comprises:
    a counter to measure the oscillator frequency at each pulse of the PPS signal;
    an adjuster to adjust the timer period register value based on the measured oscillator frequency and the sampling rate; and
    a timer to adjust, based on the adjusted timer period register value, the sampling times.

4. The device of claim 1, further comprising:
    a signal conditioner to reduce the magnitude of the input signal prior to the ADC converting the input signal into the digital samples.

5. The device of claim 1, further comprising:
    a management processor to time stamp the plurality of metrics based on a timestamp signal, wherein the timestamp signal is generated by the receiver.

6. The device of claim 1, further comprising:
    a transceiver to transmit the plurality of time-stamped metrics to a data center.

7. The device of claim 1, further comprising:
    a display module to display the plurality of time-stamped metrics.

8. A device, comprising:
    a first input to receive an oscillator signal from an oscillator;
    a second input to receive a pulse-per-second (PPS) signal from a receiver;
    an output coupled to an analog-to-digital converter (ADC);
    a counter to measure an oscillator frequency ($f_{osc}$) of the oscillator signal between two consecutive pulses of the PPS signal;
    an adjuster to adjust a timer period register value ($N_i$) based on the oscillator frequency ($f_{osc}$) and a sampling rate ($F_s$) of the device; and
    a timer to adjust, based on the adjusted timer period register value, a plurality of sampling times between the two consecutive pulses of the PPS signal;
    wherein:
        the ADC converts an input signal into digital samples at each of the plurality of sampling times;
        the adjuster is configured to, based on the oscillator frequency ($f_{osc}$) and the sampling rate ($F_s$), calculate an ideal timer period register value ($N_{ideal}$) which is a number of cycles of oscillator signal between two sampling times;
        the adjuster is configured to adjust the timer period register value ($N_i$) for each two consecutive sampling times distributed between the two consecutive PPS signals to minimize deviation from the ideal timer period register value ($N_{ideal}$), the adjusted timer period register value ($N_i$) of the data processor for a period between an (i-1) and an ith sample is determined by:

$$N_i = \begin{cases} N_L & \left(\text{if } \left|\sum_{k=2}^{i-1}(N_k) + N_L - (i-1)N_{ideal}\right| < \left|\sum_{k=2}^{i-1}(N_k) + N_H - (i-1)N_{ideal}\right|\right) \\ N_H & \left(\text{if } \left|\sum_{k=2}^{i-1}(N_k) + N_L - (i-1)N_{ideal}\right| \geq \left|\sum_{k=2}^{i-1}(N_k) + N_H - (i-1)N_{ideal}\right|\right), \quad i \geq 3 \\ \text{round}\left(\dfrac{f_{osc}}{F_s}\right), & i = 2 \end{cases}$$

where $N_L = \text{floor}\left(\dfrac{f_{osc}}{F_s}\right)$ and $N_H = \text{ceiling}\left(\dfrac{f_{osc}}{F_s}\right)$;

and
the first sample is taken at the PPS signal.

9. The device of claim 8, wherein, between two consecutive pulses of the PPS signal, the timer period register value is on average equal to the oscillator frequency divided by the sampling rate.

10. The device of claim 8, wherein a first digital sample of the digital samples between two consecutive pulses of the PPS signal is synchronized to the PPS signal.

11. The device of claim 8, further comprising:
a data queue module to store the digital samples from the ADC; and
a calculation module to generate a plurality of metrics based on the digital samples stored in the data queue module.

12. The device of claim 11, wherein the plurality of metrics include one or more measurements of frequency, magnitude, phase, harmonic level, signal-to-noise ratio, sag, and swell of the input signal.

13. A method, comprising:
converting an input signal into digital samples at each of a plurality of sampling times, wherein the input signal is received from a power grid; and
adjusting the sampling times between two consecutive pulses of a pulse per second signal based on the pulse-per-second (PPS) signal generated by a receiver;
wherein adjusting comprises:
measuring an oscillator frequency ($f_{osc}$) of an oscillator;
calculating an ideal timer period register value ($N_{ideal}$), which is a number of cycles of oscillator signal between two sampling times, based on the oscillator frequency ($f_{osc}$) and a sampling rate ($F_s$);
adjusting a timer period register value ($N_i$) for each two consecutive sampling times distributed between the two consecutive PPS signals to minimize deviation from the ideal timer period register value ($N_{ideal}$), the timer period register value ($N_i$) for a period between an (i-1) and an ith sample is determined by:

$$N_i = \begin{cases} N_L & \left(\text{if } \left|\sum_{k=2}^{i-1}(N_k) + N_L - (i-1)N_{ideal}\right| < \left|\sum_{k=2}^{i-1}(N_k) + N_H - (i-1)N_{ideal}\right|\right) \\ N_H & \left(\text{if } \left|\sum_{k=2}^{i-1}(N_k) + N_L - (i-1)N_{ideal}\right| \geq \left|\sum_{k=2}^{i-1}(N_k) + N_H - (i-1)N_{ideal}\right|\right), \quad i \geq 3 \\ \text{round}\left(\dfrac{f_{osc}}{F_s}\right), & i = 2 \end{cases}$$

where $N_L = \text{floor}\left(\dfrac{f_{osc}}{F_s}\right)$ and $N_H = \text{ceiling}\left(\dfrac{f_{osc}}{F_s}\right)$;

and
the first sample is taken at the PPS signal.

14. The method of claim 13, further comprising:
reducing the magnitude of the input signal prior to converting the input signal into digital samples.

15. The method of claim 13, wherein measuring the oscillator frequency comprises:
receiving an oscillating signal from the oscillator;
receiving the PPS signal from the receiver; and
counting a number of cycles of the oscillating signal between two consecutive pulses of the PPS signal.

16. The method of claim 13, further comprising:
storing the digital samples in a data queue module; and
generating a plurality of metrics based on the digital samples stored in the data queue module.

17. The method of claim 16, wherein the plurality of metrics include one or more measurements of frequency, magnitude, phase, harmonic level, signal-to-noise ratio, sag, and swell of the input signal.

18. The method of claim 16, further comprising:
time stamping the plurality of metrics based on a timestamp signal generated by the receiver.

19. The method of claim 16, further comprising:
transmitting the plurality of time-stamped metrics to a data center.

20. The method of claim 16, further comprising:
displaying the plurality of time-stamped metrics on a display module.

* * * * *